United States Patent [19]

Nakamura et al.

[11] Patent Number: 5,019,117
[45] Date of Patent: May 28, 1991

[54] PLASMA APPARATUS

[75] Inventors: Seiichi Nakamura; Satoshi Nakayama; Takashi Inoue, all of Amagasaki, Japan

[73] Assignee: Sumitomo Metal Industries Ltd., Osaka, Japan

[21] Appl. No.: 364,585

[22] Filed: Jun. 12, 1989

Related U.S. Application Data

[63] Continuation of Ser. No. 137,052, Dec. 23, 1987, abandoned.

[30] Foreign Application Priority Data

| Dec. 29, 1986 | [JP] | Japan | 61-309560 |
| Jun. 30, 1987 | [JP] | Japan | 62-164981 |
| Jun. 30, 1987 | [JP] | Japan | 62-164982 |
| Jul. 31, 1987 | [JP] | Japan | 62-193542 |
| Sep. 16, 1987 | [JP] | Japan | 62-231343 |

[51] Int. Cl.$^5$ .............................. C23C 16/48
[52] U.S. Cl. .............................. 118/723; 427/39; 422/186.05; 204/298.19; 156/345
[58] Field of Search .............. 427/39; 118/723; 204/298.19; 422/186.05; 156/345

[56] References Cited

U.S. PATENT DOCUMENTS

| 4,369,205 | 1/1985 | Winterling | 427/39 |
| 4,401,054 | 8/1983 | Matsuo et al. | 427/47 |
| 4,606,802 | 8/1986 | Kobayashi | 204/298.19 |
| 4,865,712 | 9/1989 | Mintz | 204/298.19 |

FOREIGN PATENT DOCUMENTS

| 56-155535 | 12/1981 | Japan . | |
| 56036 | 4/1982 | Japan . | |
| 154620 | 8/1985 | Japan . | |
| 0218826 | 11/1985 | Japan . | |
| 61-26597 | 2/1986 | Japan | 427/47 |
| 0087868 | 5/1986 | Japan . | |
| 087884 | 5/1986 | Japan . | |
| 125133 | 6/1986 | Japan . | |
| 135126 | 6/1986 | Japan . | |
| 172334 | 8/1986 | Japan . | |
| 181534 | 8/1986 | Japan . | |
| 213377 | 9/1986 | Japan . | |

OTHER PUBLICATIONS

Vossen Thin Film Processes, Academic Press, N.Y., 1978, pp. 131-136.

Primary Examiner—Richard Bueker
Attorney, Agent, or Firm—Burns, Doane, Swecker & Mathis

[57] ABSTRACT

The present invention relates to a plasma apparatus, in which a plasma is generated by the use of an electron cyclotron resonance, said plasma being introduced into a sample chamber where a sample is housed through a plasma outlet window by the use of a magnetic field for use in the electron cyclotron resonance, and said sample being subjected to a film-formation or an etching, characterized by that the distribution of magnetic flux density on a surface of the sample can be improved to uniform the plasma density, whereby subjecting the sample with the film-formation of uniformly thick or a uniform etching, by disposing a magnetic field forming means capable of forming a magnetic filed, wherein the magnetic flux density at the peripheral edge portion of the sample is higher than that at the central portion of the sample, on a side opposite to the plasma outlet window relatively to the sample.

8 Claims, 18 Drawing Sheets

PLASMA APPARATUS

This application is a continuation of application Ser. No. 07/137,052, filed Dec. 23, 1987 now abandoned.

BACKGROUND OF THE INVENTION

1. Field of the Invention

The present invention relates to a plasma apparatus used as a CVD (Chemical Vapor Deposition) apparatus, an etching apparatus and the like.

2. Description of the Prior Art

Since a plasma apparatus utilizing an electron cyclotron resonance can form a plasma having a high activity at a low gas pressure and bring out a plasma flow having a large diameter, it can be applied to the formation of a thin film, etching and the like in a highly integrated semi-conductor element and the like. And, its investigation and development are progressing.

FIG. 1 is a longitudinal sectional view showing a conventional plasma apparatus constructed as a thin film forming apparatus. Reference numeral 31 designates a plasma chamber. Said plasma chamber 31 is provided with a microwave inlet 31c sealed up with a silica glass plate 31b at a center of an upper wall thereof and a plasma outlet window 31d at a position opposite to said microwave inlet 31c at a center of a lower wall thereof, said microwave inlet 31c being connected with one end of a wave guide 32, which is connected with a microwave generator (not shown) at the other end, a sample chamber 33 being arranged so as to face to the plasma outlet window 31d, and an exciting coil 34 being arranged concentrically with said sample chamber 33 so as to surround from the plasma chamber 31 to one end portion of the wave guide 32 connected with the plasma chamber 31.

The sample chamber 33 is provided with a sample stage 35 arranged at a position opposite to the plasma outlet window 31d, a sample 100, such as a disc wafer, being placed on the sample stage 35 as it is or detachably by means of a static absorption and the like, and the sample chamber 33 being provided with an exhaust port 33a, which is connected with an exhauster (not shown), opened at a lower wall thereof. In addition, reference numerals 31g, 33g designate material gas supply pipes, reference numeral 31e designating a water-supply system of a cooling water, and reference numeral 31f designating a drain system of the cooling water.

With such a thin film forming apparatus, the plasma chamber 31 and the sample chamber 33, which have been set at a desired vacuosity, are supplied with a material gas, a high-frequency electric field due to a microwave being applied in the plasma chamber 31 while forming a magnetic field by the exciting coil 34, to form a plasma, the resulting plasma being led out to the vicinity of the sample 100 on the sample stage 35 within the sample chamber 33 from the plasma chamber 31 through the plasma outlet window 31d by a divergent magnetic field formed by the exciting coil 34, and a surface reaction due to ions and radical particles in the plasma flow being brought on a surface of the sample 100 to form a film on the surface of the sample 100 (Japanese Patent Application Laid-Open No. 155535/1981).

However, with such the conventional plasma apparatus, the plasma brought about in the plasma chamber 31 is extracted to a side of the sample 100 within the sample chamber 33 through the plasma outlet window 31d along a line of magnetic force of the divergent magnetic field formed by the exciting coil 34 but the plasma generated in the plasma chamber 31 is not uniform, that is, a plasma density at a central portion of the plasma chamber 31 becomes higher than that at a periphery of the plasma chamber 31. This uneven distribution of plasma density has an enlarged influence upon the sample 100 by the divergent magnetic field as it is. In the case where the sample 100 is arranged in a concentrical manner with the plasma outlet window 31d, a difference occurs between the central portion and the periphery of the sample 100 in deposition rate, whereby making a film thickness uneven.

It is a reason why the uneven distribution of the plasma generated in the plasma chamber 31 is projected toward the sample 100 by the divergent magnetic field as it is that electrons in the plasma take a cyclotron movement (Larmor movement) having a cyclotron radius of several tens microns to several hundreds microns around the divergent magnetic field while ions in the plasma follow the electrons by an electric field having an amphoteric polarity generated between them and the electrons, so that the plasma is restricted by the line of magnetic force as a whole.

FIG. 2 is a diagram showing a positional relation between the divergent magnetic field formed by the exciting coil 34 and the sample 100. As obvious from FIG. 2, the line of magnetic force of the divergent magnetic field formed by the exciting coil 34 is expanded as it approaches to the sample 100 through the plasma outlet window 31d, so that the uneven distribution of the plasma generated in the plasma chamber 31 is projected on the sample 100 in an enlarged manner. Accordingly, in the case where a film is deposited, the uneven film thickness can not be avoided.

Such an uneven film thickness or etching depth has been found not only in the thin film forming apparatus but also in the case where it is used as an etching apparatus (Japanese Patent Application Laid-Open No. 47728/1984).

SUMMARY OF THE INVENTION

The present invention was achieved in order to solve the above described problems.

A first object of this invention is to provide a plasma apparatus, in which a magnetic field forming means for forming a magnetic field so that a density of magnetic field at a periphery of a sample may be higher than that at a central portion of the sample is arranged on a side opposite to a plasma outlet window relatively to the sample to make a density of plasma above the sample to be uniform.

A second object of this invention is to provide a plasma apparatus, in which a coil is disposed around a magnetic body as a magnetic field forming means to achieve a fine regulation of magnetic flux density.

A third object of this invention is to provide a plasma apparatus, in which a magnetic flux density at a peripheral portion of a sample and that at a central portion of the sample are independently controlled by a magnetic field forming means to easily improve the distribution of magnetic flux density on a surface of the sample.

A fourth object of this invention is to provide a plasma apparatus, in which a magnetic field formed by an exciting coil, a magnetic field of the same direction and a magnetic field of an opposite direction are simultaneously formed by a magnetic field forming means to remarkably increase a magnetic flux density at an appointed position.

A fifth object of this invention is to provide a plasma apparatus, in which a magnetic field forming means comprises exciting coils integrally disposed on an inside circumference and an outside circumference of a cylindrical magnetic body to simplify the magnetic field forming means in construction and form an ideal magnetic field.

A sixth object of this invention is to provide a plasma apparatus, in which a magnetic field forming apparatus comprises a permanent magnet and a magnetic body in combination to make a power supply facility for the magnetic field forming means unnecessary, thereby, simplifying construction.

The above and further objects and features of the invention will more fully be apparent from the following detailed description with accompanying drawings.

DESCRIPTION OF THE PREFERRED EMBODIMENTS

The preferred embodiments, in which the present invention is constructed as a thin film forming apparatus, are concretely described below with reference to the drawings.

Figure 3:
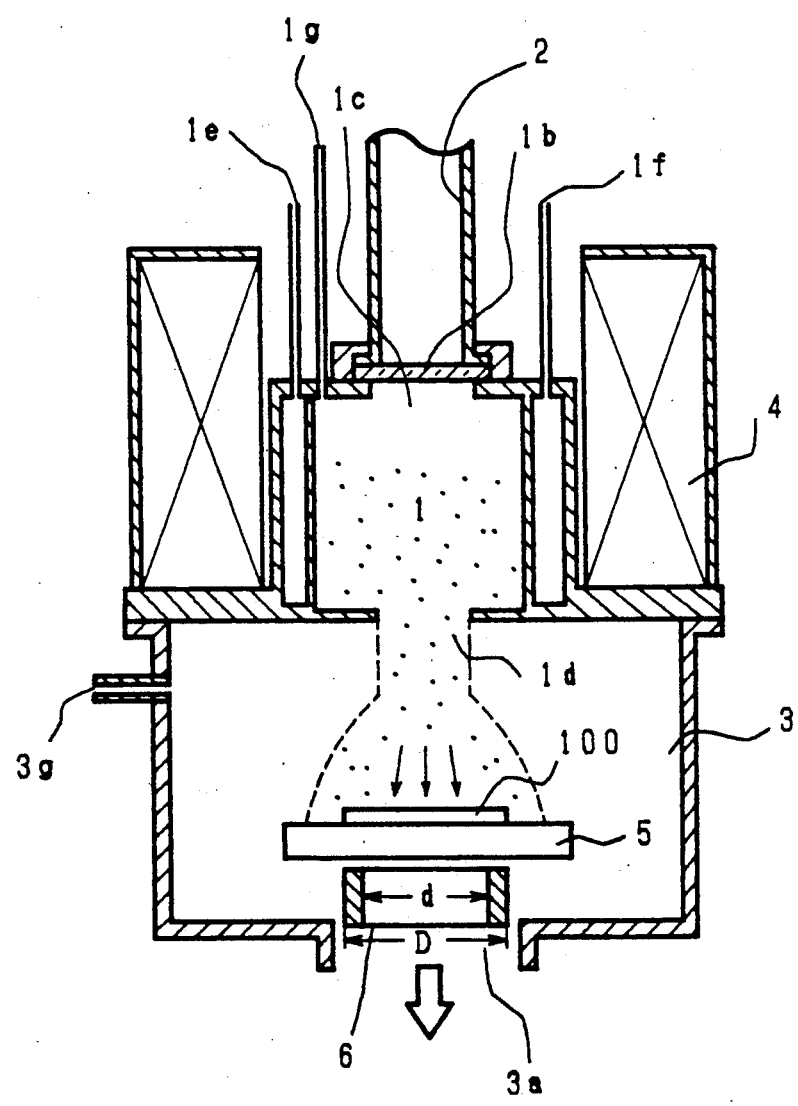
FIG. 3 is a longitudinal sectional view showing a plasma apparatus according to the present invention.

FIG. 3 is a longitudinal sectional view showing a plasma apparatus according to the present invention. Referring to FIG. 3, reference numeral 1 designates a plasma chamber, reference numeral 2 designating a wave guide, reference numeral 3 designating a sample chamber, and reference numeral 4 designating an exciting coil.

The plasma chamber 1 is provided with a microwave inlet 1c closed by a silica glass plate 1b at a center of an upper wall thereof and a circular plasma outlet window 1d at a position opposite to said microwave inlet 1c of a center of a lower wall thereof, said microwave inlet 1c being connected with one end of the wave guide 2, the sample chamber 3 being arranged so as to face to the plasma outlet window 1d, and the exciting coil 4 being arranged around said sample chamber 3 so as to surround from the plasma chamber 1 to one end portion of the wave guide 2 connected with the plasma chamber 1.

The other end portion of the wave guide 2 is connected with a microwave generator (not shown) to introduce the microwave into the plasma chamber 1 through the microwave inlet 1c. The exciting coil 4 is connected with a direct current power source (not shown) to form a magnetic field by passing a direct current through the exciting coil 4 so that a plasma may be formed by introducing a microwave into the plasma chamber 1. This magnetic field is a divergent magnetic field with a magnetic flux density reduced toward a side of the sample chamber 3. The plasma formed in the plasma chamber 1 is introduced into the sample chamber 3.

A sample stage 5 is disposed at a position opposite to the plasma outlet window 1d at a center of a lower portion within the sample chamber 3 so that a sample 100, such as a wafer, may be placed on the sample stage 5 as it is or detachably by means of a static adsorption and the like. In addition, an exhaust port 3a connected with an exhauster (not shown) is opened at a bottom wall.

Reference numerals 1g, 3g designate a material gas supply pipe, reference numeral 1e designating a water-supply system of a cooling water, and reference numeral 1f designating a drain system of the cooling water.

And, in a plasma apparatus according to the present invention, a cylindrical magnetic body 6 as the magnetic field forming means is disposed almost concentrically with the plasma outlet window 1d, the sample stage 5 and the sample 100 placed on the sample stage 5 below the sample stage 5. An outside diameter D of this magnetic body 6 is set at a value almost equal to a diameter of the sample 100 or more. In addition, an inside diameter d of this magnetic body is set at a value other than 0, that is to say, so that $0 < d < D$ may be held good.

Figure 4:
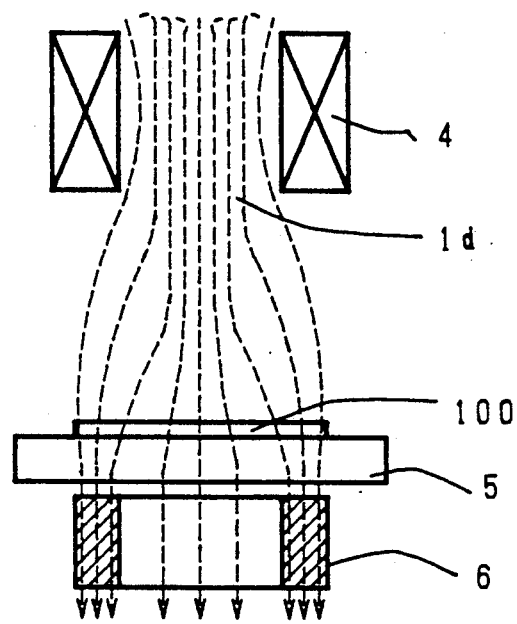
FIG. 4 is a schematic diagram showing lines of magnetic force in a plasma apparatus according to the present invention.

FIG. 4 is a diagram showing a line of magnetic force in the case where the above described discoid sample 100 and the cylindrical magnetic body 6 having the outside diameter D. The line of magnetic force of the divergent magnetic field formed by the exciting coil 4 is drawn toward the magnetic body 6. That is to say, the line of magnetic force expanded outside of the magnetic body 6 is pulled back while the line of magnetic force within the magnetic body 6 is spread outward. As a result, the distribution of density of the plasma drawn out of the plasma chamber 1 on a surface of the sample 100 is made uniform.

The above described will be described below in more detail.

It is important in the present invention that a magnetic field forming means capable of increasing a magnetic flux density at a peripheral portion of a sample in comparison with that at a central portion of the sample, that is, a cylindrical magnetic body 6 in the above described preferred embodiment, is used.

Figure 5:
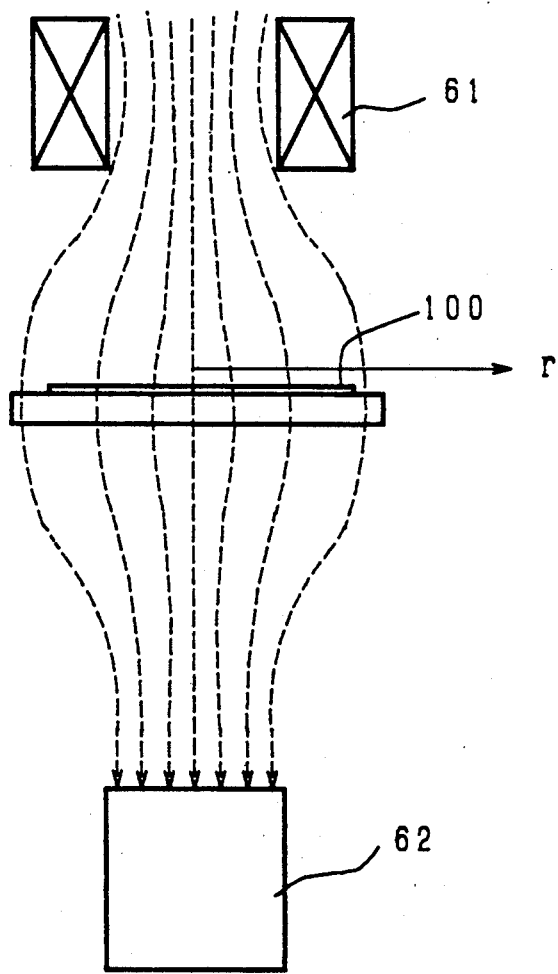
FIG. 5 is a schematic diagram showing a mirror magnetic field.

An etching apparatus, in which a plasma is generated by a microwave and a magnetic field in the same manner as in the present invention, has been disclosed in Japanese Patent Publication No. 13627/1983. A magnet is disposed on a side opposite to a coil for generating the above described magnetic field or a plasma outlet window relatively to a sample to form a mirror magnetic field. FIG. 5 is a schematic diagram showing a line of magnetic force in the case where the mirror magnetic field is formed. Referring to FIG. 5, reference numeral 61 designates a coil for forming a divergent magnetic field and reference numeral 62 designates a magnet for forming the mirror magnetic field. In such the mirror magnetic field, a magnetic flux formed by the coil 61 does not diverge but is converged due to the existence of the magnet 62. However, such conditions cause the magnetic flux density to be higher at the central portion and lower at a peripheral portion. In the case where the sample 100 is placed within this magnetic field, even though the plasma can be economically used, it can not be expected to make uniform the plasma density on the surface of the sample 100.

Figure 6:
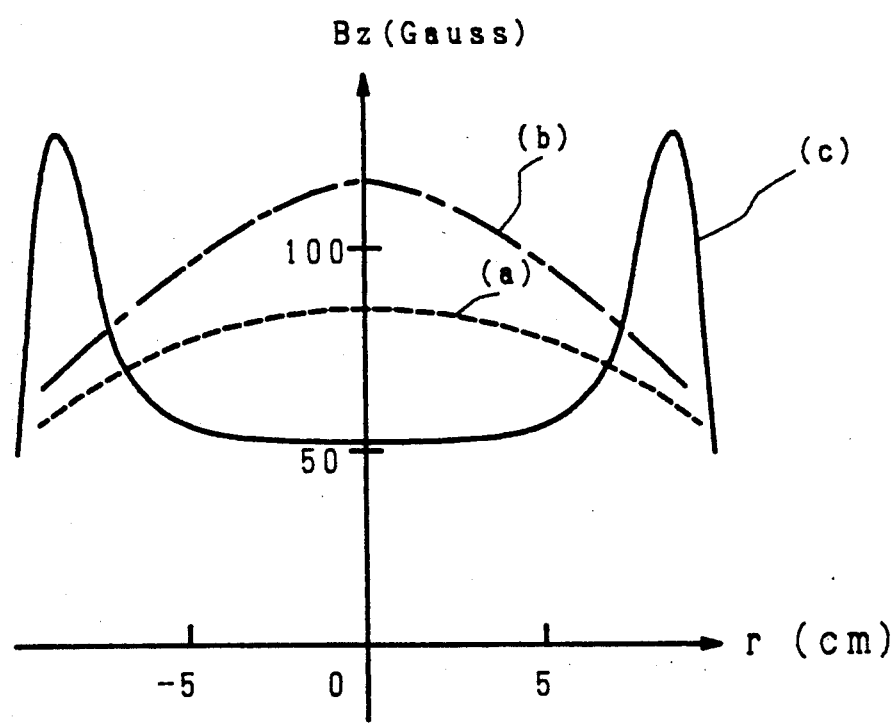
FIG. 6 is a diagram showing the distribution of magnetic flux density in various kinds of magnetic field.

FIG. 6 is a graph showing a relation between a distance r in a radial direction from the center of the sample (refer to FIG. 5) and the distribution of the magnetic flux density Bz, which is a component in the direction vertical to the sample stage at the sample stage 5, for the divergent magnetic field [broken line (a)], mirror magnetic field [one-dotted oblique line (b)] and the magnetic field [full line (c)] obtained by a magnetic field forming means according to the present invention. In FIG. 6, the distance r (cm) from the center of the sample is taken on an axis of abscissa while the vertical component of the magnetic flux density Bz (Gauss) is taken on an axis of ordinate.

As obvious from FIG. 6, the plasma apparatus according to the present invention can correct the projection of the distribution of plasma density (lower in the peripheral portion) within the plasma chamber as it is in the divergent magnetic field or mirror magnetic field by heightening the peripheral portion of the sample than the central portion of the sample.

In short, in the plasma apparatus according to the present invention, since the magnetic field forming means (magnetic body 6) is disposed on a side opposite to the plasma outlet window 1d relatively to the sample 100, of line of magnetic force of the divergent magnetic field formed toward a side of the sample chamber 3, line of magnetic force in the peripheral portion of the sample 100 or the vicinity thereof are bent in a direction intersecting the peripheral portion of the sample 100, that is, in the inside and outside direction to heighten the magnetic flux density in the peripheral portion of the sample 100, whereby uniforming the distribution of magnetic flux density on the surface of the sample 100. As a result, a thin film having a uniform thickness can be formed on the surface of the sample by using the plasma apparatus according to the present invention.

Figure 1:
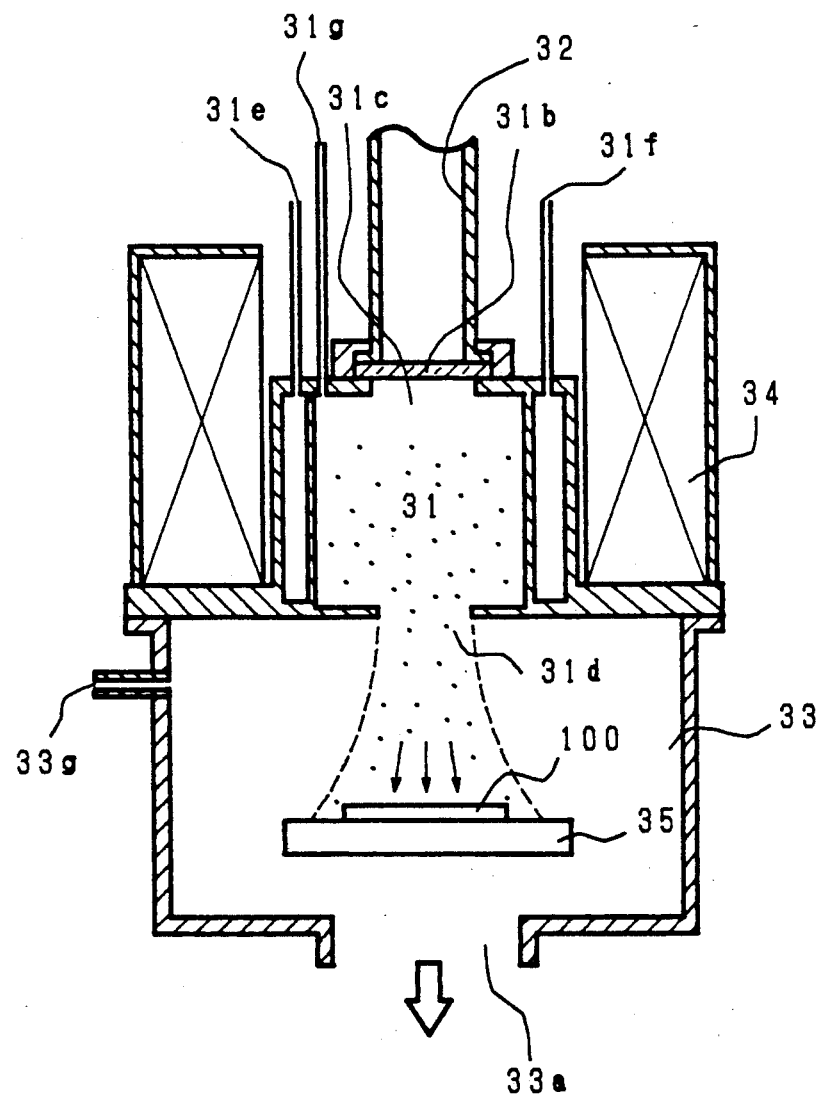
FIG. 1 is a longitudinal sectional view showing the conventional plasma apparatus.
Figure 2:
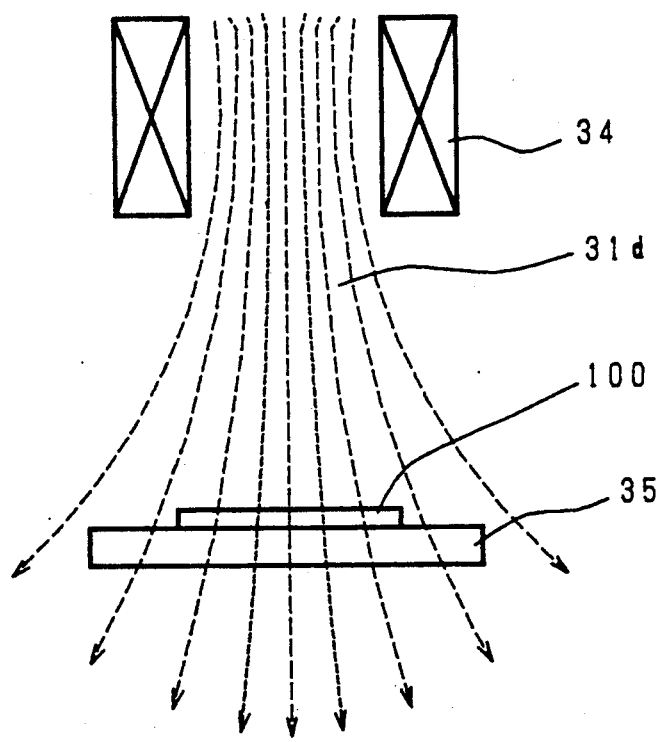
FIG. 2 is a diagram showing a relation between a divergent magnetic field and a sample in the conventional plasma apparatus.

With the above described plasma apparatus according to the present invention and the conventional apparatus shown in FIG. 1, respectively, oxygen gas was introduced into the plasma chamber 1 and SiH4 gas into the sample chamber 3, respectively, as the material gas to generate the plasma and deposit them on a Si wafer having a diameter of 5 inches disposed on the sample stage 5. The umiformity of film thickness was measured with the results that it was ±10% in the conventional apparatus but it was reduced as much as ±5% in the apparatus according to the present invention.

The uniformity of film thickness was determined by the following formula (1):

$$\pm \frac{\text{maximum film thickness} - \text{minimum film thickness}}{\text{maximum film thickness} + \text{minimum film thickness}} \times 100 (\%) \quad (1)$$

Figure 7:
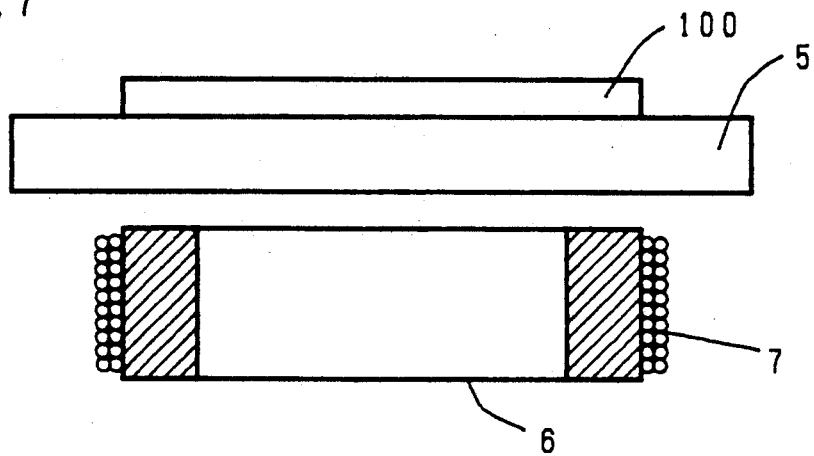
FIG. 7 is a longitudinal sectional view showing another preferred embodiment of a magnetic field forming means in a plasma apparatus according to the present invention.

In addition, FIG. 7 is a sectional view showing another construction of the magnetic field forming means in which a fine electrically conductive wire 7 insulatively coated is densely wound around a cylindrical peripheral surface of the magnetic body 6 many times without forming any gap, a direct current power source (not shown) being connected between end portions of said fine electrically conductive wire 7, and a direct current of a desired magnitude being passed through the fine electrically conductive wire 7 to finely regulate the distribution of magnetic flux density on the surface of the sample 100.

In addition, the fine electrically conductive wire 7 insulatively coated may be disposed around the magnetic body 6 in a circular shape instead of being directly wound around the peripheral surface of the magnetic body 6.

Figure 8:
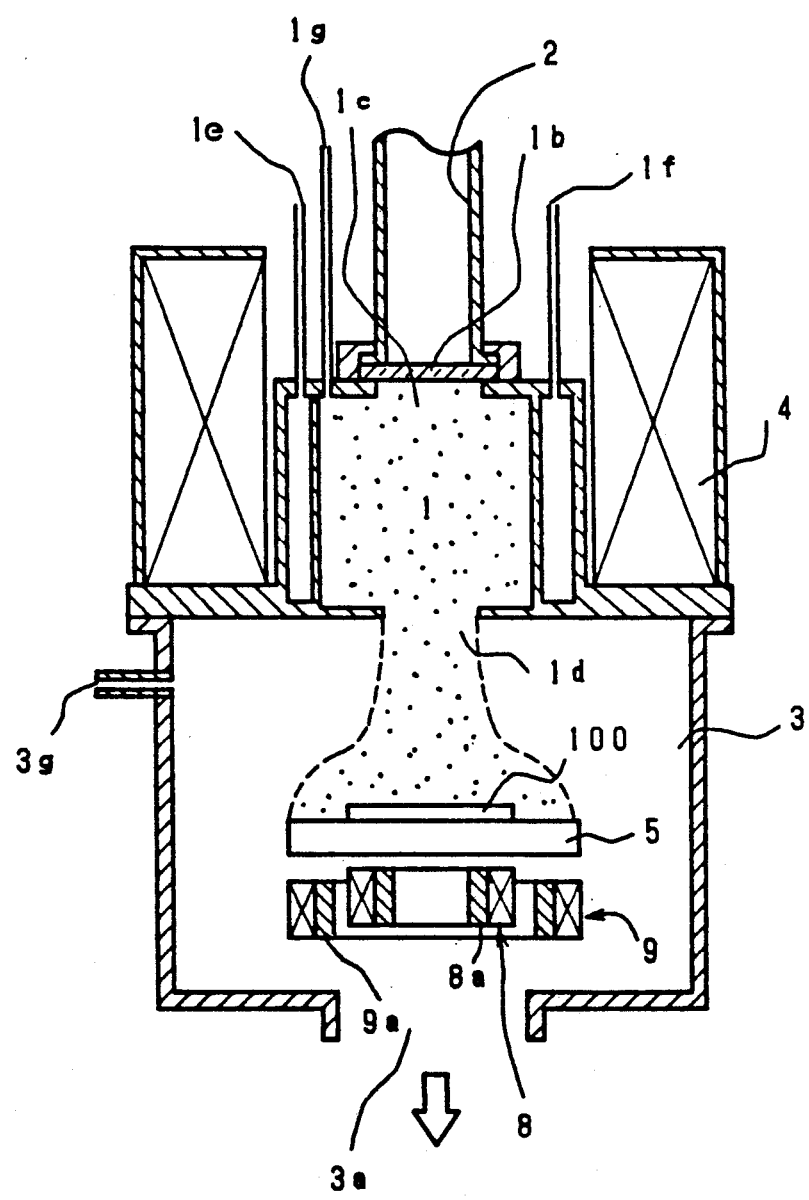
FIG. 8 is a longitudinal sectional view showing another preferred embodiment of a plasma apparatus according to the present invention.

FIG. 8 is a longitudinal sectional view showing another preferred embodiment of the plasma apparatus according to the present invention in which the magnetic field forming means is composed of two cylindrical magnets.

Two (large and small) cylindrical magnets 8, 9 constructing the magnetic field forming means are disposed on a side opposite to the plasma chamber 1 relatively to the sample stage 5, that is, below the sample stage 5, within the sample chamber 3 with the same central line as that of the microwave inlet 1c, the plasma outlet window 1d, the sample stage 5 and the like.

Respective cylindrical magnets 8, 9 comprise a cylindrical core 8a, 9a, respectively, of which periphery is wound by a lead wire so that the cylindrical magnet 8 and the cylindrical magnet 9 may be concentrically disposed with the former being arranged inside and the latter being outside and the former being slightly shifted from the latter in an up and down direction, that is, the former being disposed at a higher position while the latter is disposed at a lower position in a direction of axis shaft line. The cylindrical magnet 9 is adapted to form lines of magnetic force in the same direction as those formed by the exciting coil 4 on the central line of the magnetic field formed by the exciting coil 4. In addition, the cylindrical magnet 8 is adapted to form lines of magnetic force in a direction opposite to that of the lines of magnetic force of the magnetic field formed by the exciting coil 4 on the central line. The value of magnetic flux density of the magnetic field formed by the respective cylindrical magnets 8, 9 is not specially limited but every value capable of uniforming the distribution of plasma on the surface of the sample 100 can be selected.

In addition, the construction other than the magnetic field forming means is same as that shown in FIG. 3, so that its description is omitted here.

Figure 9:
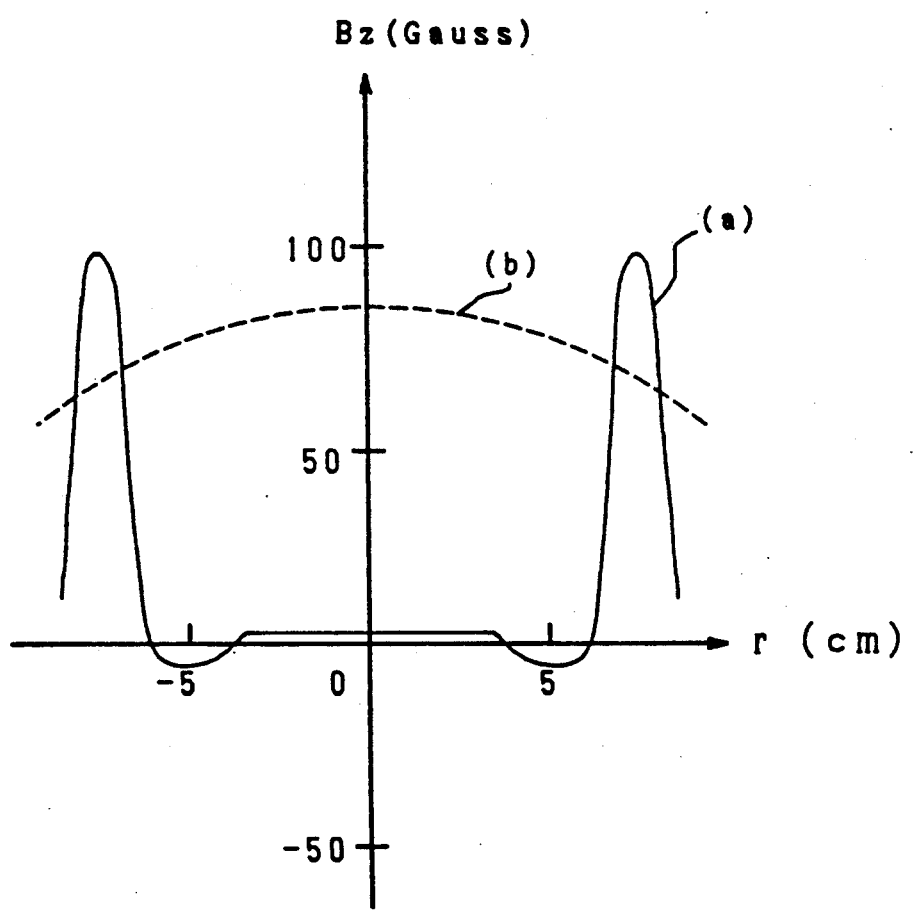
FIG. 9 is a diagram showing the distribution of magnetic flux density on a surface of a sample in a plasma apparatus according to the present invention shown in FIG. 10.

FIG. 9 is a graph showing a relation between a distance r (cm) in the radial direction from the center of the sample and a vertical component of the magnetic flux density Bz (Gauss) in the plasma apparatus according to the preferred embodiment shown in FIG. 8. Referring to FIG. 9, the full line (a) shows the distribution of density of the present preferred embodiment. Also the distribution of density in the conventional apparatus is shown in FIG. 9 [broken line (b)] for comparison.

As obvious from this diagram showing the distribution of the vertical component of the magnetic flux density, in the conventional apparatus the magnetic field is formed substantially merely by the exciting coil 4. That is to say, the vertical component of the magnetic flux density Bz of the divergent magnetic field shows a maximum value at the central portion of the sample stage 5 and is gradually reduced as it is separated from there. On the contrary, in the present invention the magnetic flux density Bz shows a maximum value above the outside cylindrical magnet 9 and is rapidly reduced both outward and inwardly from there.

This seems to be a result of that the lines of magnetic force diverging outside of the sample stage 5 of the divergent magnetic field formed by the exciting coil 4 are drawn toward a side of the peripheral edge portion of the sample stage 5 by the outside cylindrical magnet 9 while the lines of magnetic force in the vicinity of the central portion of the sample stage 5 is diverged toward a side of the peripheral edge portion of the sample stage 5 by the inside cylindrical magnet 8 in an opposite manner.

In such the preferred embodiment, the inside plasma is locked in by the outside cylindrical magnet 9 during the process of introducing the plasma generated in the plasma chamber 1 into the sample chamber 3 through the plasma outlet window 1d using the divergent magnetic field formed by the exciting coil 4 while the central plasma is diverged toward the peripheral edge portion of the sample stage 5 by the magnetic field formed by the inside cylindrical magnet 8, whereby relatively increasing the density of plasma in the peripheral edge portion of the sample 100. That is to say, the distribution characteristics of plasma density, which are reduced toward the peripheral edge portion from the central portion of the sample 100, as seen in the case where the magnetic field is formed merely by the exciting coil 4 can be improved in unevenness on the surface of the sample 100 by the action of both the cylindrical magnet 8 and the cylindrical magnet 9.

Accordingly, it is necessary only to dispose the peripheral edge portion of the sample 100 on the sample stage 5 so as to correspond to portions having a higher magnetic flux density on both sides shown in FIG. 9 and suitably set an electric current and the like passing through the outside cylindrical magnet 9 and the inside cylindrical magnet 8 so as to uniform the dispersion of plasma.

In the present preferred embodiment, the magnetic flux density at the peripheral edge portion of the sample 100 is controlled mainly by the outside cylindrical magnet 9 while the magnetic flux density at the central portion of the sample 100 is controlled mainly by the inside cylindrical magnet 8. Accordingly, the respective cylindrical magnets 8, 9 control the magnetic flux density at the central portion and the peripheral edge portion of the sample 100 independently, whereby easily uniforming the magnetic flux density on the surface of the sample.

With the preferred embodiment shown in FIG. 8 and the conventional apparatus shown in FIG. 1, respectively, $N_2$ gas (flow rate of 35 sccm) was introduced into the plasma chamber 1 and $SiH_4$ gas (flow rate of 28 sccm) into the sample chamber 3, respectively, as the material gas to generate the plasma at a microwave power of 600 W and form a silicon nitride film on a silicon wafer having a diameter of 5 inches on the sample stage 5 using the generated plasma. The uniformity of film thickness and the deposition rate were measured. With the conventional apparatus, the uniformity of film thickness was ±9.8% and the deposition rate was 2400 Å/min while with the present preferred embodiment, the uniformity of film thickness was able to be reduced as much as ±4%. In addition, the plasma could be efficiently used by the plasma-locking effect by the cylindrical magnet 9. As a result, the deposition rate was able to be increased as fast as 2700 Å/min. In addition, the uniformity of film thickness was calculated by the above described formula (1).

Although in the present preferred embodiment a direct electric current is passed through the cylindrical magnet 9 so that the lines of magnetic force may be formed in the same direction as that of the lines of magnetic force formed by the exciting coil 4 on the central line of the magnetic field formed by the exciting coil 4 while a direct electric current is passed through the cylindrical magnet 8 in the same manner so that the lines of magnetic force may be formed in the direction opposite to that of the lines of magnetic force of the magnetic field formed by said exciting coil 4 on the central line, if the above described is reversely carried out, that is, a direct electric current is passed through the cylindrical magnet 9 so that the lines of magnetic force may be formed in the direction opposite to that of the lines of magnetic force formed by the exciting coil 4 on the central line of the magnetic field formed by the exciting coil 4 while a direct electric current is passed through the cylindrical magnet 8 so that the lines of magnetic force may be formed in the same direction as that of the lines of magnetic force of the magnetic field formed by the exciting coil 4 on the central line, the vertical component of the magnetic flux density Bz on the sample sample stage shows a maximum value above the cylindrical magnet 8 and is rapidly reduced both outward and inward from there, whereby being capable of obtaining a distribution equivalent to the distribution of magnetic flux density Bz shown in FIG. 9. In addition, it goes without saying that even though the combination of the core 8a of the cylindrical magnet 8 and the coil and the combination of the core 9a of the cylindrical magnet 9 and the coil are replaced by one piece of cylindrical permanent magnet respectively, the same effect as in the above described preferred embodiment can be attained.

In addition, although the case where the cylindrical magnets 8, 9 are formed of the respective cores 8a, 9a wound by lead wires was shown in the above described preferred embodiment, the core may not be used but merely a lead wire wound in a circular shape may be used for the cylindrical magnet through which a direct electric current is passed so as to form the lines of magnetic force in the opposite direction on the central line to lines of magnetic force of the magnetic field formed by the exciting coil 4.

In addition, although the construction, in which the cylindrical magnets 8, 9 are disposed immediately below the sample stage 5, was shown in said preferred embodiment, the position of disposing the cylindrical magnets 8, 9 is not specially limited but every position, at which a magnetic field having an appointed magnetic flux density can be formed on the surface of the sample 100, that is, for example, they may be disposed outside of the sample chamber 3 or they may be formed integrally with the sample stage 5 or they may be adapted to serve also as the sample stage 5.

Figure 10:
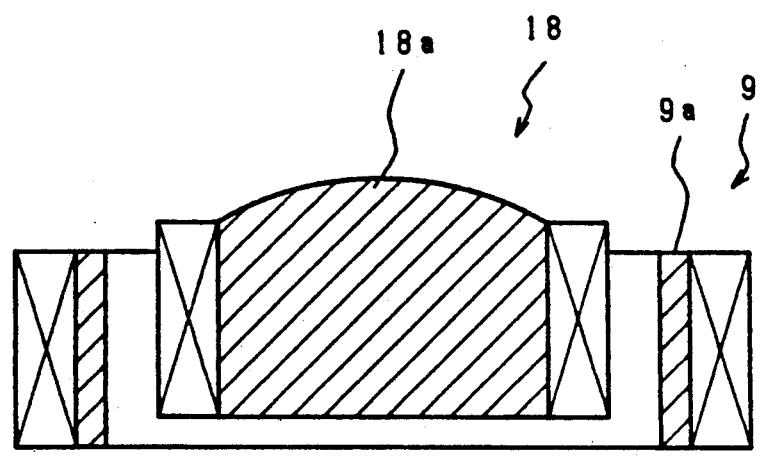
FIGS. 10, 11 are longitudinal sectional views showing other preferred embodiments of a magnetic field forming means in a plasma apparatus according to the present invention.
Figure 11:
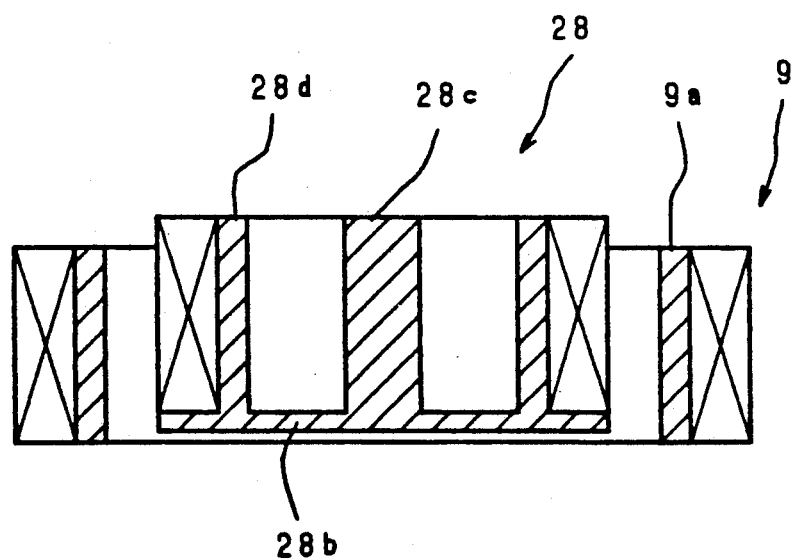

FIGS. 10, 11 are enlarged longitudinal sectional views showing modifications of the magnetic field forming means according to the preferred embodiment shown in FIG. 8. In the magnetic field forming means shown in FIG. 10, a magnet positioned inside is solid and columnar and constructed in the form of a columnar magnet 18 with a lead wire wound around a peripheral surface of a core 18a formed by expanding an end face, which is positioned on a side of the sample 100, upward so as to form a spherical surface.

In such the magnetic field forming means, the lines of magnetic force formed by the columnar magnet 18 exhibit a higher permeability toward the central portion side from the peripheral edge portion and the divergent effect for the plasma is higher toward the central line of the sample 100. In other words, it is possible to reduce the vertical component of the magnetic flux density Bz on the central line of the sample 100, whereby still more uniforming the plasma distribution.

In the magnetic field forming means shown in FIG. 11, a magnet 28 positioned inside has a construction with a columnar portion 28c disposed at a center of one surface of a disc bottom plate portion 28b and a cylindrical portion 28d disposed at a position closer to the peripheral edge portion so that they may concentrically stand with a desired interval therebetween and a lead wire wound around a peripheral surface of said cylindrical portion 28d.

With such the magnetic field forming means, the lines of magnetic force formed by the cylindrical magnet 28 selectively exhibit a higher permeability than other portions due to the magnetic passage formed by the columnar portion 28c at the central portion and the magnetic passage formed by the cylindrical portion 28d at the peripheral edge portion, whereby increasing the magnetic flux density, so that the divergent effect for the plasma at the central portion of the sample 100 can be heightened and the vertical component of the magnetic flux density Bz can be reduced and as a result, the plasma can be uniformed in the same manner as in the preferred embodiment shown in said FIG. 10.

In addition, other constructions and effects shown in FIGS. 10, 11 are substantially same as in the magnetic field forming means according to the preferred embodiment shown in said FIG. 8 and the corresponding parts are marked with same numerals, so that their description is omitted.

Figure 12:
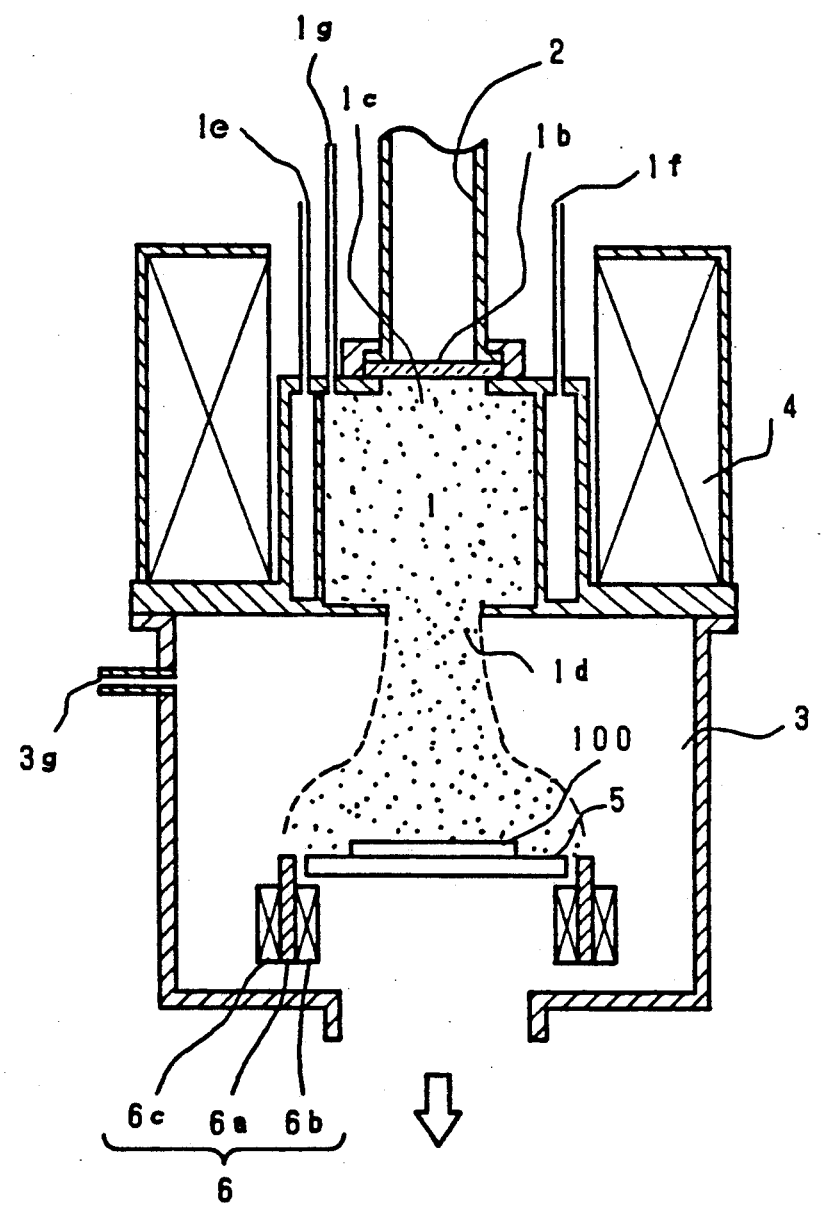
FIG. 12 is a longitudinal sectional view showing another preferred embodiment of a plasma apparatus according to the present invention.

FIG. 12 is a longitudinal sectional view showing another preferred embodiment of the plasma apparatus according to the present invention. A magnetic field forming means 6 disposed below a sample stage 5 in the present preferred embodiment is integrally provided with exciting coils 6b, 6c stuck to an inside circumferential surface and a periphery of a cylindrical core 6a. An inside diameter of the cylindrical core 6a is set so as to be slightly larger than an outside diameter of the sample stage 5. The cylindrical core 6a is disposed at a position closer to the bottom of the sample stage 5 within a sample chamber 3 with making an axial direction thereof coincident with a direction of width of the sample 100 under the condition that an upper end portion thereof is put on the sample stage 5.

In addition, the constructions other than the magnetic field forming means 6 are same as those shown in FIG. 3, so that their description is omitted here.

Figure 13:
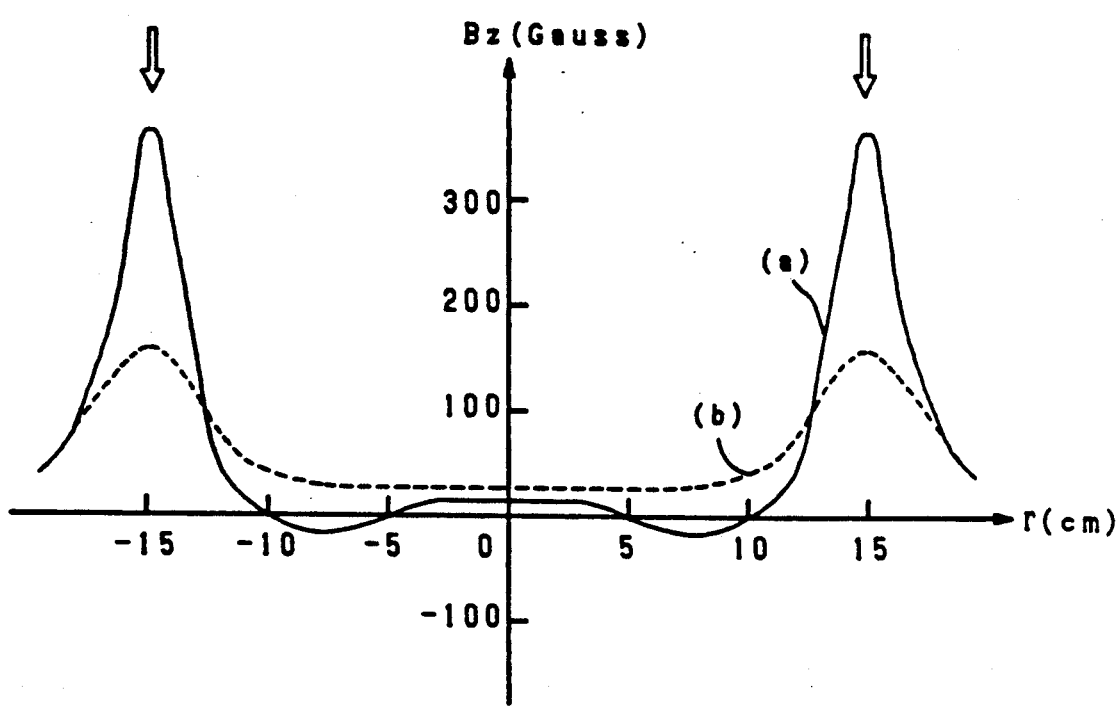
FIG. 13 is a diagram showing the distribution of magnetic flux density on a surface of a sample in a plasma apparatus according to the present invention shown in FIG. 12.
Figure 14:
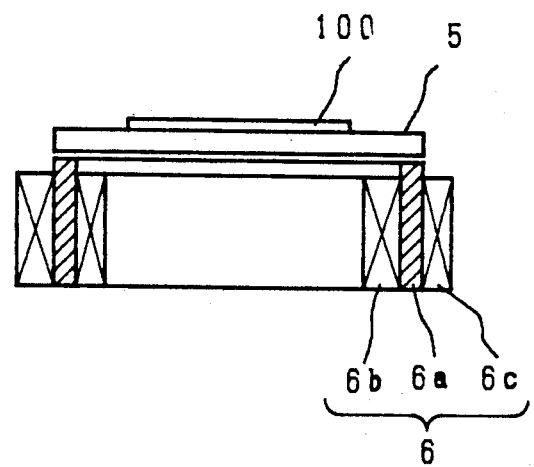
FIGS. 14 to 17 are longitudinal sectional views showing other preferred embodiments of a magnetic field forming means in a plasma apparatus according to the present invention.
Figure 15:
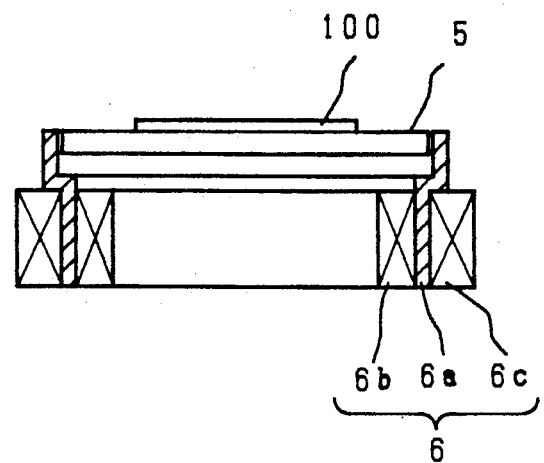
Figure 16:
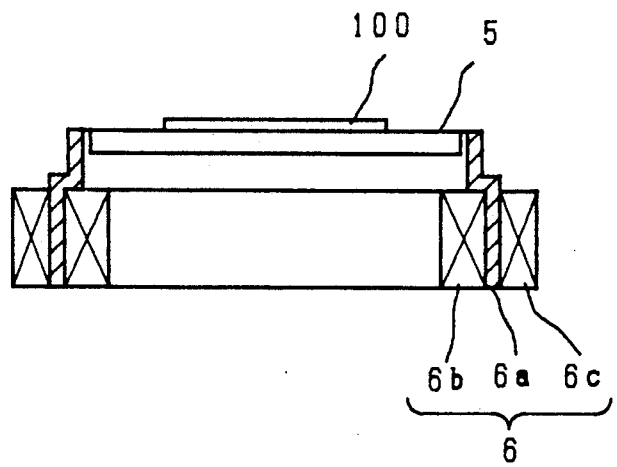
Figure 17:
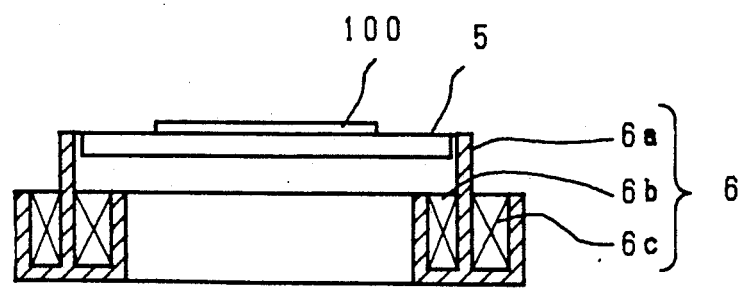

FIG. 13 is a graph showing a relation between a distance r (cm) in a radial direction from the center of the sample and the vertical component of the magnetic flux density (Gauss) in the plasma apparatus according to the preferred embodiment shown in FIG. 12. Referring to FIG. 13, a full line (a) shows the case where the distance between the sample 100 and the cylindrical core 6a is 9 mm while a broken line (b) shows the case where said distance is 29 mm. In addition, a white arrow shows a position of the cylindrical core 6a.

It is found from this FIG. 13 that a magnetic field, in which a magnetic flux density in a peripheral edge portion of a sample 100 is sufficiently higher than that at a central portion of the sample 100, can be obtained by a magnetic field forming means disposed closer to the sample 100. It can also be found from FIG. 13 that a simple and ideal magnetic field, in which the direction of the magnetic field is same all over the area, is obtained.

As the result of the attainment of such the magnetic field, the distribution of plasma density led onto the surface of the sample 100 can be uniformed.

In the preferred embodiment shown in FIG. 12, the magnetic field forming means 6 is integrally constructed, so that it is handy and can be easily incorporated in the plasma apparatus. Accordingly, the assembling operation in the vicinity of the sample stage 5 of the plasma apparatus becomes easy.

FIGS. 14 to 17 are enlarged longitudinal sectional views showing the modifications of the magnetic field forming means according to the preferred embodiment shown in FIG. 12. The preferred embodiment shown in FIG. 16 relates to the case where an outside diameter of a core 6a is nearly equalized to an outside diameter of a sample stage 5 and the core 6a is surely housed below the sample stage 5. The preferred embodiment shown in FIG. 15 relates to the case where a lower portion of a core 6a is slightly shortened in diameter and the shortened-diameter portion is provided with coils 6b, 6c. The preferred embodiment shown in FIG. 16 relates to the case where a lower portion of a core 6a is slightly enlarged in diameter and the enlarged-diameter portion is provided with coils 6b, 6c. The preferred embodiment shown in FIG. 17 relates to the case where a core 6a is provided with sponson portions in both the enlarged-diameter direction and the shortened-diameter direction at a lower portion thereof to additionally expand the core 6a. In every modification, it is sufficient to obtain such the distribution of magnetic flux density shown in FIG. 13 in the vicinity of the sample 100 by the magnetic field forming means 6 comprising the core 6a provided with the coils 6b, 6c.

Figure 18:
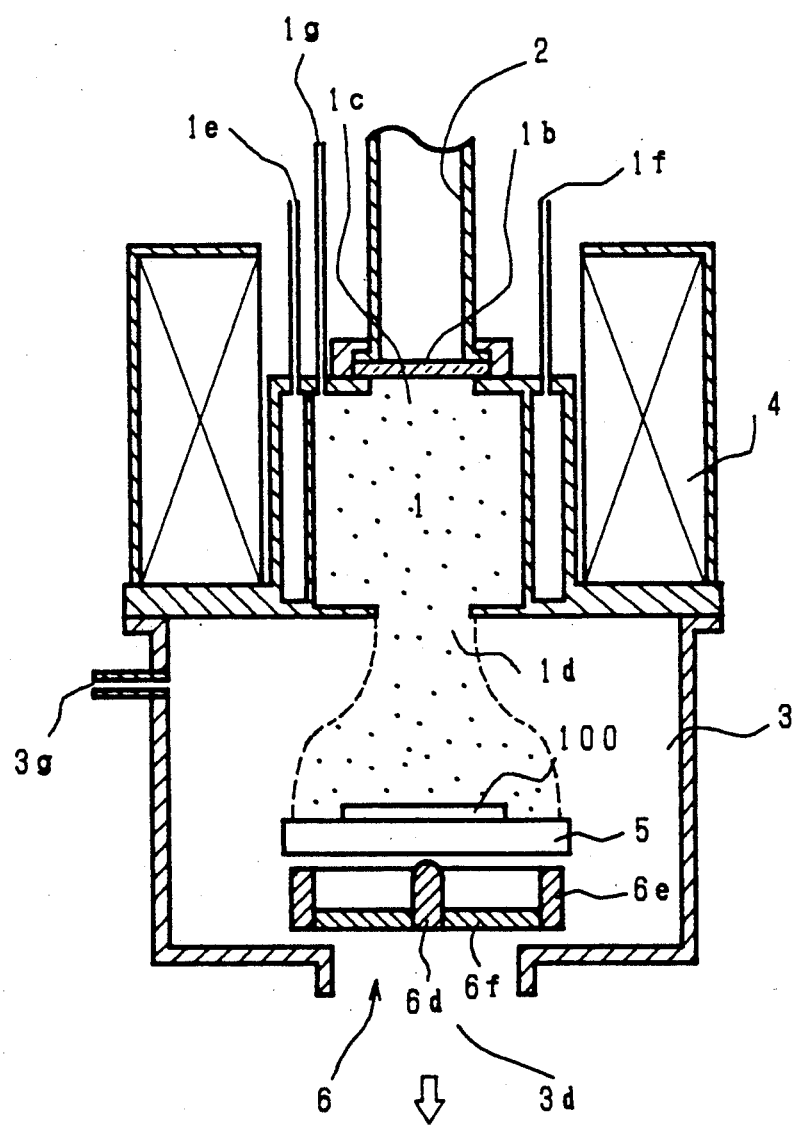
FIG. 18 is a longitudinal sectional view showing another preferred embodiment of a plasma apparatus according to the present invention shown in FIG. 18.

FIG. 18 is a longitudinal sectional view showing another preferred embodiment of the plasma apparatus according to the present invention. In the present preferred embodiment, a magnetic field forming means 6 disposed below a sample stage 5 comprises a permanent magnet and a paramagnetic member in combination. That is to say, in the present preferred embodiment, the magnetic field forming means 6 is provided with a rod-like core 6d made of a paramagnetic material at a center thereof and a circular core 6e made of a paramagnetic material disposed around a periphery of said rod-like core 6d concentrically with it, and a plurality of permanent magnets 6f are disposed in a circular space between the rod-like core 6d and the circular core 6e so that said space may be filled up.

Figure 19:
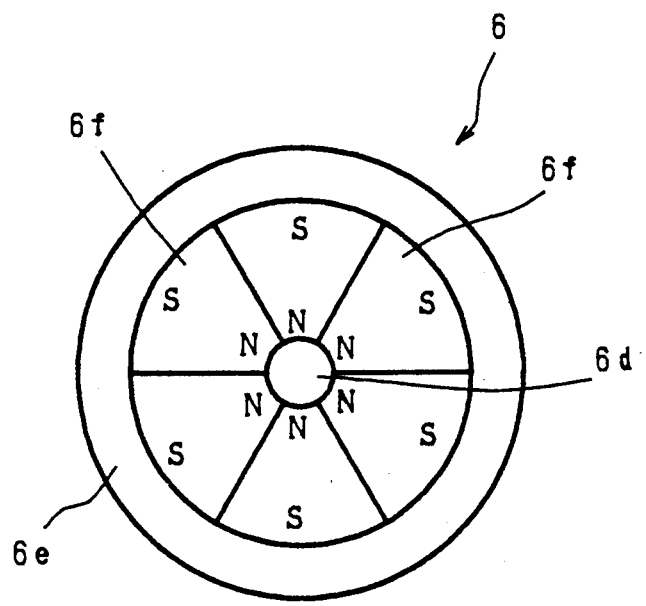
FIG. 19 is a plan view showing a magnetic field forming means in a plasma apparatus according to the present invention shown in FIG. 18.
Figure 20:
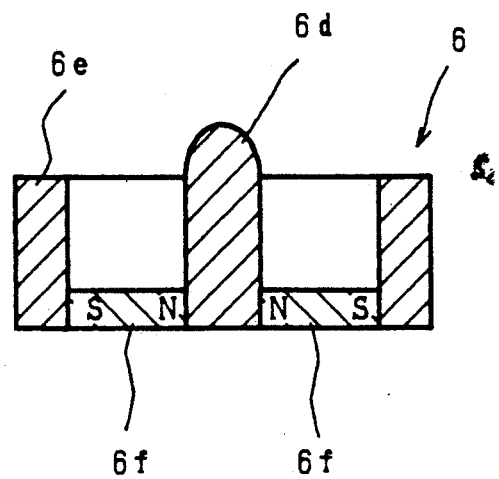
FIG. 20 is a longitudinal sectional view showing a plasma apparatus according to the present invention shown in FIG. 18.

FIG. 19 is a plan view showing the magnetic filed forming means according to the present preferred embodiment and FIG. 20 is a longitudinal sectional view showing the magnetic field forming means 6 according to the present preferred embodiment. Each permanent magnet 6f is fan-shaped. Its central side is a N-pole while its peripheral edge side is a S-pole and a plurality of permanent magnets are arranged in a closely engaged manner under the condition that the N-pole is positioned on a side of the central portion, that is, the rod-like core 6d side, while the S-pole is positioned on a side of the peripheral edge portion, that is, the circular core 6e side.

Materials of the rod-like core 6d, circular core 6e and permanent magnet 6f are not specially limited but the known materials are suitably selected.

In addition, the constructions other than the magnetic field forming means 6 are same as those shown in FIG. 3, so that their description is omitted here.

Figure 21:
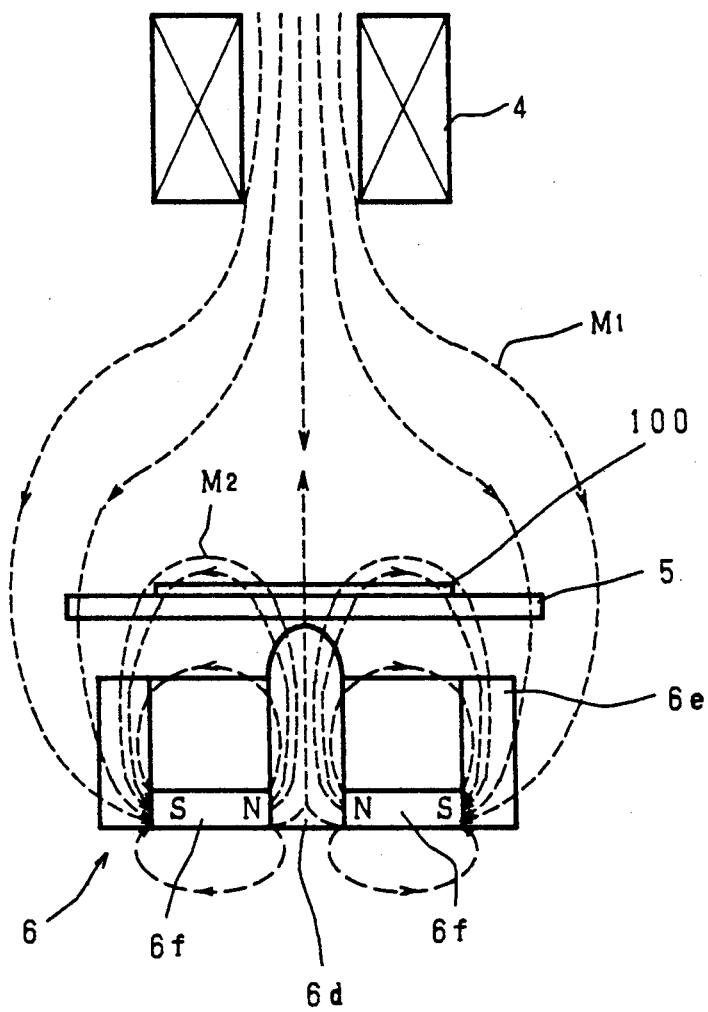
FIG. 21 is a diagram showing the distribution of lines of magnetic force in a plasma apparatus according to the present invention shown in FIG. 18.

FIG. 21 is a diagram showing the distribution of the lines of magnetic force formed by the exciting coil 4 and the magnetic field forming means 6, in which the line of magnetic force $M_1$ forming a divergent magnetic field turning toward a side of the sample chamber 3 formed by the exciting coil 4 is formed so as to pass the positions closer to the peripheral edge portion of the sample stage 5 while almost of the magnetic force $M_2$ of the magnetic field formed by the permanent magnets 6f of the magnetic field forming means 6 is formed so as to turn toward the side of the peripheral edge portion of the sample stage 5 from the central portion of the sample stage 5 through the rod-like core 6d from the N-pole on the side of the central portion and then arrive at the S-pole on the side of the peripheral edge portion through the circular coil 6e from the peripheral edge portion. The line of magnetic force immediately arriving at the S-pole from the N-pole of the permanent magnet 6f without passing through the coils 6d, 6e is remarkably reduced.

Accordingly, the magnetic flux density in the peripheral portion of the sample 100 is relatively heightened while the magnetic flux density at the control portion of the sample 100 is relatively lowered by the existence of the magnetic field forming means 6.

Figure 22:
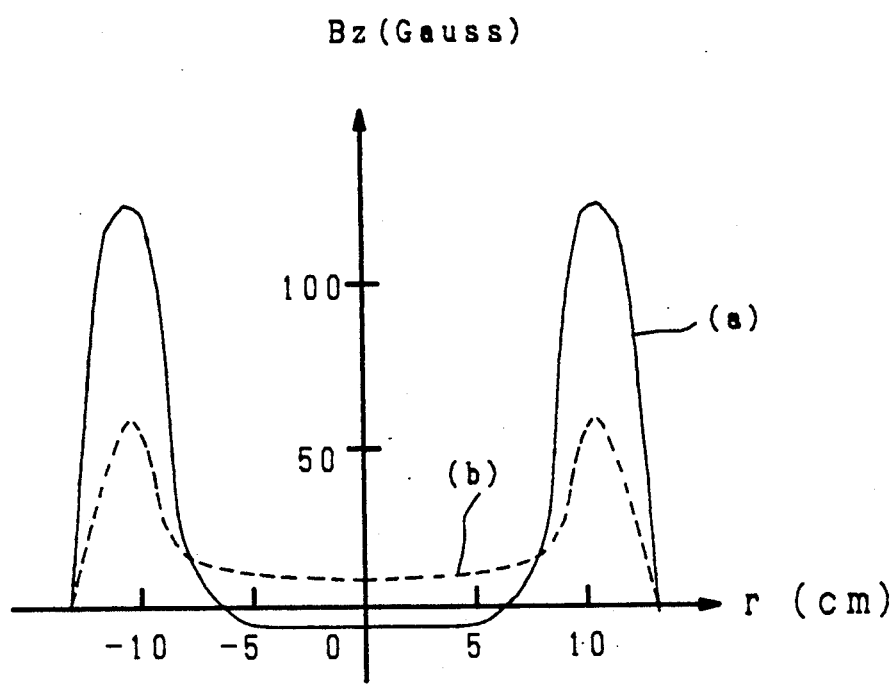
FIG. 22 is a diagram showing the distribution of magnetic flux density on a surface of a sample in a plasma apparatus according to the present invention shown in FIG. 18.
Figure 24:
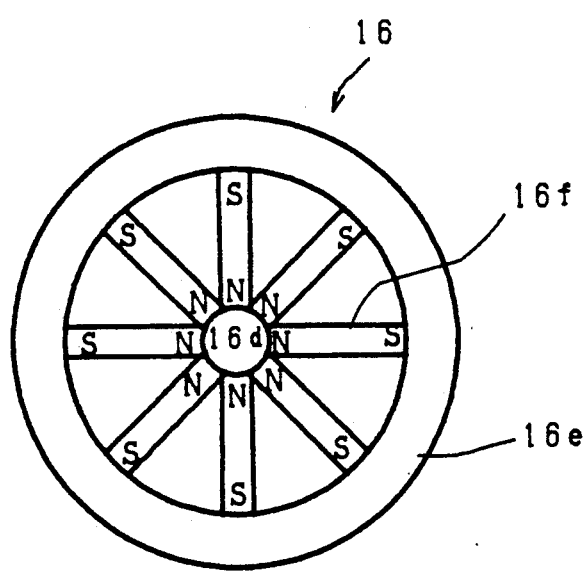
FIG. 24 is a plan view of another preferred embodiment of a magnetic field forming means in a plasma apparatus according to the present invention.

FIG. 22 is a graph showing a relation between a distance r (cm) in the radial direction from the center of the sample and a vertical component of the magnetic flux density Bz (Gauss) in the plasma apparatus according to the present preferred embodiment shown in FIG. 18. Referring to FIG. 24, a full line (a) shows the distribution of density on the surface of the sample stage 5 while a broken line (b) shows the distribution of density at a distance of 1 cm above the surface of the sample stage 5.

It is obvious from FIG. 22 that the condition that the magnetic field forming means 6 is not disposed, that is, the combination of a distribution pattern of magnetic flux density formed by the divergent magnetic filed generated by the exciting coil 4 and the distribution of magnetic flux density formed by the magnetic field forming means 6, leads to the possibility of obtaining a magnetic field in which the magnetic flux density at the peripheral edge portion of the sample 100 is sufficiently higher than that at the central portion of the sample 100. Thus, the plasma density on the surface of the sample 100 can be uniformed.

In this preferred embodiment, since the magnetic field forming means comprises the permanent magnets and the paramagnetic member in combination, no power supply facility is required, whereby the magnetic flux density on the surface of the sample can be uniformed in a simple construction.

With the preferred embodiment shown in FIG. 18 and the conventional apparatus shown in FIG. 1, a silicon wafer having a diameter of 6 inches was placed on the sample stage 5 concentrically with the sample stage 5 and SiH$_4$ gas was introduced into the sample chamber 3 at a flow rate of 28 sccm while N$_2$ gas was introduced into the sample chamber at a flow rate of 35 sccm to form a silicon oxide film on the silicon wafer at a microwave power of 600 W. As a result, the deposition rate of 2100Å/min and the uniformity of film thickness was ±3.5% were obtained. On the contrary, with the conventional apparatus, the deposition rate was 2100Å/min and the uniformity of film thickness was ±20%. The uniformity of film thickness was calculated by the above described formula (1).

Figure 23:
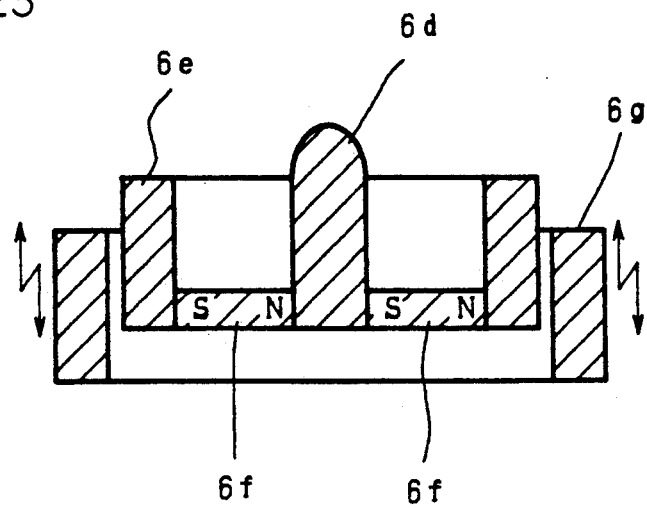
FIG. 23 is a longitudinal sectional view showing another preferred embodiment of a magnetic field forming means in a plasma apparatus according to the present invention.

FIG. 23 is an enlarged longitudinal sectional view showing a modification of the magnetic field forming means 6 according to the preferred embodiment shown in FIG. 18. The periphery of the magnetic field forming means 6 shown in FIGS. 19, 20 is surrounded by a second circular core 6g made of a paramagnetic material disposed concentrically with a circular core 6e of the magnetic field forming means 6 made of a paramagnetic material likewise and this second circular core 6g is movable in the direction of an axis shaft line thereof, in other words, in the direction of approaching to and going away from the sample stage 5.

In addition, an assembly comprising a rod-like core 6d, circular core 6e and permanent magnets 6f may be integrally ascended and descended instead of moving the second circular core 6g.

In such the preferred embodiment, the distribution of magnetic flux density immediately above the surface of the sample stage 5 or still further above there can be regulated to still further uniform the plasma distribution in the vicinity of the surface of the sample 100.

In addition, other constructions and operations shown in FIG. 23 are substantially same as those in the FIGS. 19, 20 and corresponding parts are marked with the same numerals, so that their description is omitted.

Figure 25:
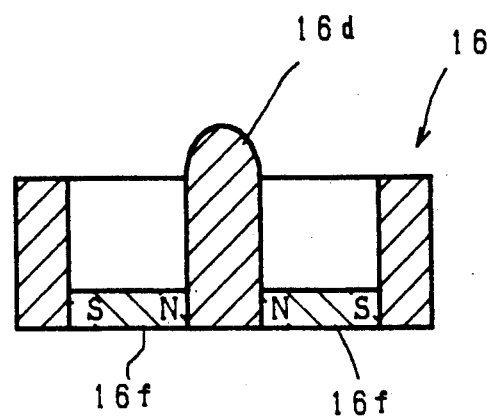
FIG. 25 is a longitudinal sectional view showing a magnetic field forming means shown in FIG. 24.
Figure 26:
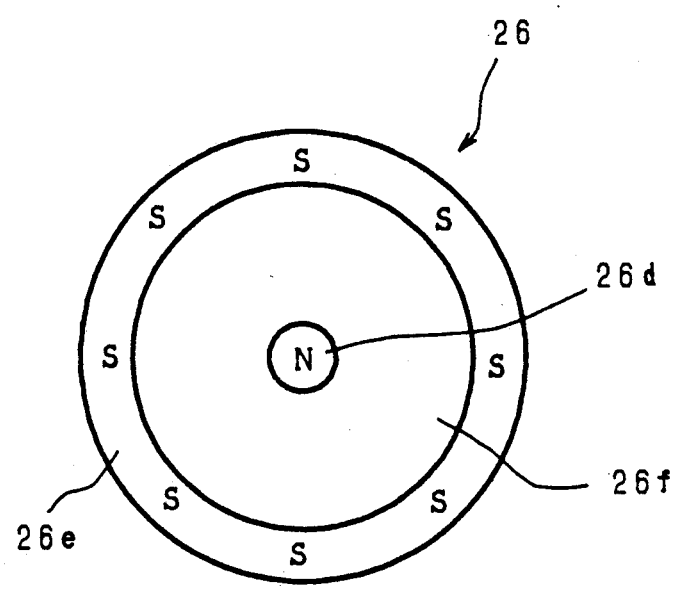
FIG. 26 is a plan view showing another preferred embodiment of a magnetic field forming means in a plasma apparatus according to the present invention.
Figure 27:
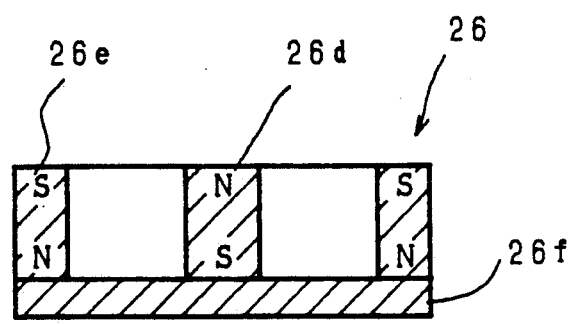
FIG. 27 is a longitudinal sectional view showing a magnetic field forming means shown in FIG. 26.

FIGS. 24, 25 and FIGS. 26, 27 show the modifications of the magnetic field forming means according to the preferred embodiment shown in FIG. 18. FIGS. 24, 26 are plan views showing each magnetic field forming means while FIGS. 25, 27 are longitudinal sectional views showing each magnetic field forming means.

The magnetic filed forming means 16 shown in FIGS. 24, 25 comprises rod-like permanent magnets 16f disposed radially in the circumferential direction at almost regular angular intervals between the rod-like core 16d and the circular core 16e made of a paramagnetic material with positioning the N-pole thereof on the central side and the S-pole thereof on a side of the peripheral edge portion.

In such the preferred embodiment, an advantage occurs in that the permanent magnet 16f itself is simplified in construction.

The magnetic field forming means 26 shown in FIGS. 26, 27 comprises a rod-like permanent magnet 26d with a sample stage side as a N-pole and a circular permanent magnet 26e with the sample stage side as a S-pole disposed around said rod-like permanent magnet 26d concentrically with the rod-like permanent magnet 26d, said rod-like permanent magnet 26d and said circular permanent magnet 26e being concentrically disposed on a disc core 26f made of a paramagnetic material.

In such the preferred embodiment, the lines of magnetic force are formed toward an upper end as the S-pole of the circular permanent magnet 26e from an upper end as the N-pole of the rod-like permanent magnet 26d positioned at the center and the plasma moved along the direction of the lines of magnetic force is dispersed from a side of the rod-like permanent magnet 26d to a side of the circular permanent magnet 26e, in other words, from a side of the central portion of the sample stage 5 to a side of the peripheral edge portion, whereby uniforming the plasma distribution. In addition, almost of the lines of magnetic force arriving at the rod-like permanent magnet 26d from the N-pole of the circular permanent magnet 26e pass through the disc core 26f, whereby effectively improving the distribution of magnetic flux density.

_ In addition, other constructions and operations are substantially same as those shown in FIGS. 19, 20 and corresponding parts are marked with the same numerals, so that their description is omitted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A plasma apparatus, in which a plasma is generated within a plasma chamber by the use of an electron cyclotron resonance and the generated plasma is introduced into a sample chamber provided with a sample stage for placing a sample thereon through a plasma outlet window by the use of a magnetic field formed by an exciting coil disposed around said plasma chamber, comprising two electromagnets each having a cylindrical or columnar core with diameters different from each other and a coil wound around each core, said electromagnets being disposed concentrically with said exciting coil on a side opposite to the plasma outlet window relative to the sample on said sample stage for forming magnetic fields, the direction of the magnetic field generated by one of said electromagnets being the same as that of said exciting coil and the direction of the magnetic field generated by the other of said electromagnets being opposite to that of said exciting coil.

2. A plasma apparatus as set forth in claim 1, in which one of said electromagnets comprises a disc-shaped yoke provided with a columnar yoke at a center of one surface thereof and a cylindrical core, and a coil wound around said cylindrical core, said cylindrical core being disposed concentrically with said yokes and having a diameter smaller than a diameter of the disc shape yoke, and in which the other of said electromagnets comprises a cylindrical core having an inside diameter larger than an outside diameter of the one electromagnet.

3. A plasma apparatus as set forth in claim 1, in which the one electromagnet comprises a substantially columnar core thicker at the central portion than at a peripheral portion thereof and in which said other electromagnet comprises a cylindrical core having an inside diameter larger than a diameter of said columnar core.

4. A plasma apparatus, in which a plasma is generated within a plasma chamber by the use of an electron cyclotron resonance and the generated plasma is introduced into a sample chamber provided with a sample stage for placing a sample thereon through a plasma outlet window by the use of a magnetic field formed by an exciting coil disposed around said plasma chamber, comprising an electromagnet having a cylindrical core and two coils each wound inside and outside of said core, said electromagnet being disposed concentrically with said exciting coil on a side opposite to the plasma outlet window relative to the sample on said sample stage for forming magnetic fields, the magnetic field direction generated by one coil being same as that of said exciting coil and the magnetic field direction generated by the other coil being opposite to that of said exciting coil.

5. A plasma apparatus as set forth in claim 4, in which said core is provided with a sponson portion projecting inwardly and outwardly at an end portion of said core on a side opposite to the sample.

6. A plasma apparatus as set forth in claim 4, in which an outside diameter of said core is nearly equal to a diameter of said sample stage.

7. A plasma apparatus as set forth in claim 4, in which the core diameter of the portion on a side opposite to the sample is shorter than that of said the other portion and this shorter-diameter portion is surrounded by the coils.

8. A plasma apparatus as set forth in claim 4, in which the core diameter of the portion on a side opposite to the sample is larger than that of the other portion and this larger-diameter portion is surrounded by the coils.

* * * * *